United States Patent
Luo et al.

(10) Patent No.: US 10,613,145 B2
(45) Date of Patent: Apr. 7, 2020

(54) CONFIGURATION AND TESTING METHOD AND SYSTEM FOR FPGA CHIP USING BUMPING PROCESS

(71) Applicant: SINO IC TECHNOLOGY CO., LTD., Pudong New Area (CN)

(72) Inventors: Bin Luo, Pudong New Area (CN); Hua Wang, Pudong New Area (CN); Shouyin Ye, Pudong New Area (CN); Xuefei Tang, Pudong New Area (CN); Jianbo Ling, Pudong New Area (CN); Jianming Ye, Pudong New Area (CN)

(73) Assignee: SINO IC TECHNOLOGY CO., LTD., Pudong New Area (CN)

( * ) Notice: Subject to any disclaimer, the term of this patent is extended or adjusted under 35 U.S.C. 154(b) by 336 days.

(21) Appl. No.: 15/541,434

(22) PCT Filed: Nov. 4, 2016

(86) PCT No.: PCT/CN2016/104545
§ 371 (c)(1),
(2) Date: Jul. 3, 2017

(87) PCT Pub. No.: WO2017/092544
PCT Pub. Date: Jun. 8, 2017

(65) Prior Publication Data
US 2018/0024194 A1 Jan. 25, 2018

(30) Foreign Application Priority Data
Jul. 15, 2016 (CN) .......................... 2016 1 0560149

(51) Int. Cl.
*G01R 31/3185* (2006.01)
*G01R 31/319* (2006.01)

(52) U.S. Cl.
CPC ................ *G01R 31/318519* (2013.01); *G01R 31/31908* (2013.01); *G01R 31/31919* (2013.01)

(58) Field of Classification Search
CPC combination set(s) only.
See application file for complete search history.

(56) References Cited

FOREIGN PATENT DOCUMENTS

CN 104199756 A * 12/2014

* cited by examiner

*Primary Examiner* — Son T Le
(74) *Attorney, Agent, or Firm* — Maier & Maier, PLLC

(57) ABSTRACT

A configuration and testing method and system for an FPGA chip using a bumping process are disclosed, the method includes creating configuration files for an FPGA chip under test and storing them in a memory; reading, by a master FPGA, a configuration code stream of corresponding configuration codes from the mass memory, configuring the FPGA chip under test via an external test interface, and determining whether the configuration is successful; if the configuration is successful, converting the configuration code stream into a test signal source file that is recognizable, executable and reusable by multiple pieces of test equipment by a developed algorithm and a conversion tool; and automatically loading the test signal source file onto the FPGA chip under test in real time by advanced test equipment.

12 Claims, 5 Drawing Sheets

CLB_RAM_16*2 Function Description:
1. A1-A4 are RAM address pins
2. BY and BX are RAM data input pins
3. CLK is a RAM clock input pin, while SR is a RAM W/R input pin Model :

CLB_RAM_1_out_debug:  IN+a+A+b+A
    CLB_RAM_2_out_debug:  IN+a+A+b+A+c+d+B
    CLB_RAM_3_out_debug:  IN+a+A+b+A+c+d+B+e+f
    CLB_RAM_4_out_debug:  IN+a+A+b+A+c+d+B+e+f+g+h Model Type Description and Coordinates:

| | | | |
|---|---|---|---|
| IN: | CLB_RAM_4: | C1-1 | (Input under test) |
| A : | CLB_RAM_4: | C2-1 | (Under test: left --> right) |
| B : | CLB_RAM_4: | C7-2 | (Under test: left <-- right) |
| 1 : | CLB_RAM_4: | C3-1 | (Relay: left --> right, A1-A4) |
| 2 : | CLB_RAM_4: | C5-1 | (Relay: left --> right, SR) |
| 3 : | CLB_RAM_4: | C0-1 | (Relay: left --> bottom) |
| 4 : | CLB_RAM_4: | C8-2 | (Relay: top --> left) |
| 5 : | CLB_RAM_4: | C6-2 | (Relay: right --> left) |
| 6 : | CLB_RAM_4: | C4-2 | (Relay: right --> left) |
| 7 : | CLB_RAM_4: | C1-2 | (Relay: right --> bottom) |
| 8 : | CLB_RAM_4: | C1-3 | (Relay: top --> right) |

CONFIGURATION AND TESTING METHOD AND SYSTEM FOR FPGA CHIP USING BUMPING PROCESS

TECHNICAL FIELD

The present invention relates to the field of automatic test techniques for integrated circuits (ICs) and, in particular, to a configuration and test method and system for an FPGA chip using a bumping process.

BACKGROUND

Field programmable gate arrays (FPGAs) are advanced chips developed from PAL, GAL, CPLD and other programmable chips. Current FPGAs are mostly based on look-up table techniques and are composed essentially of programmable input/output blocks (IOBs), programmable logic blocks (CLBs), programmable interconnections (PIs), configuration SRAMs, block RAMs and digital delay phase-locked loops (DLLs) and etc. Testing an FPGA involves structural analysis of resources possibly present therein, configuring the FPGA into a circuit with a specific function through test configuration, test stream implementation and other processes, and then testing the circuit at an application level for completing the testing of its functional and performance parameters.

In general terms, complete testing of the internal resources of an FPGA involves designing a variety of configuration patterns for the different testing resources, downloading them to the FPGA at multiple times, repeated application of stimuli and collection of test responses, as well as fault testing through analysis of the responses. Therefore, for an FPGA test method, how to speed up each configuration process to reduce the configuration time overhead in the testing and how to automate repeated configuration and testing to allow the fast online FPGA configuration to be combined with fast testing are critical.

Current automatic test equipment (ATE) in the IC field is designed and manufactured to be suitable for the testing of most ICs. However, FPGA testing is exceptional since it is impossible to test the internal resources of an FPGA unless the resources have been configured to allow the FPGA has an internal circuitry that meets the design or application requirements prior to the testing of its functional and performance parameters. ATE-enabled configuration in a test step generally involves generating ATE-executable test stimuli (test vectors) through modifying configuration data manually or by means of a PC program. However, when the configuration data are voluminous, for example, those for an FPGA chip using a bumping process with a large number of pins that is more than one thousand, the aforementioned conversion process will be very complex and suffer from a lack of ease of use and etc., which would make it incapable of efficient use in FPGA chip testing. Thus, in order to meet such configuration and test requirements, there is a need to develop FPGA test and configuration solutions for advanced test equipment-based testing of FPGA chips, in particular, those using a bumping process.

Currently, there are a number of methods available for FPGA configuration, including boundary-scan configuration, SPI/BPI configuration dedicatedly used by Xilinx, Inc., system ACE configuration and direct loading of configuration vectors by the system. However, the boundary-scan approach is suitable mainly for online configuration and commissioning, and the method dedicatedly used by Xilinx, Inc. allows the storage of only one section of configuration code at a time and is not suited to repeated configuration and testing. Additionally, the system ACE configuration method requires a dedicated control chip and CF card for system ACE control, making it cumbersome to be used, need increased system setup cost, take up larger space and inapplicable to scenarios with more configuration files.

SUMMARY OF THE INVENTION

In order to overcome the above shortcomings of the prior art, it is an object of the present invention to provide a configuration and test method and system for a field programmable gate array (FPGA) chip using a bumping process, in which configuration code streams are stored on mass memories, configuration codes in different address ranges in the memories are read in real time by a master FPGA, and configuration files are automatically loaded in real time by automatic test equipment (ATE) onto an FPGA chip under test via an external test interface, thereby enabling fast configuration of the FPGA chip for testing of its functional and performance parameters without needing to power-off. This entails a solution capable of real-time, fast, repeatable configuration and functional and performance testing. It allows not only rapid download of multiple configuration code streams but also a higher configuration speed and lower implementation costs.

In order to achieve the above and other objects, the present invention proposes an FPGA chip configuration and test method, comprising the steps of:

1) creating configuration files for an FPGA chip under test and storing them in mass memories, the configuration files comprising information about configuration resources necessary for testing functions of the FPGA chip, wherein each bit configuration code in the configuration files is mapped to a corresponding one of the configuration resources;

2) with a control test algorithm developed based on ATE, reading a configuration code stream consisting of corresponding configuration codes by a master FPGA from the mass memories, configuring the FPGA chip under test via an external test interface, and determining whether the configuration is successful;

3) if the configuration is successful, converting the successfully configured configuration code stream by the control test algorithm and by a conversion tool into a test signal source file recognizable and executable by the ATE, the test signal source file comprising test signal source codes reusable by multiple pieces of test equipment; and 4) automatically loading the test signal source file onto the FPGA chip under test by the ATE in real time, collecting responses output from the FPGA chip under test, determining and analyzing the test results and outputting a test data log, thereby completing the testing of a corresponding function and performance.

Further, in step 1), the configuration files may be created by providing, by the ATE, a signal indicative of a request for configuration of the FPGA chip under test and configuring by a computer an initiation signal for a test and configuration board and then stored in the mass memories.

Further, the mass memories may be flash memories.

Further, in step 2), the master FPGA may read in real time the configuration codes in different address ranges in the flash memories, with the ATE automatically loading in real time the configuration file onto the FPGA chip under test via the external test interface.

Further, in step 2), a process of the configuration may comprise parsing a bitstream file, designing a test model, retrieving the model, designing a test pattern, modifying and filling the configuration bitstream file with the pattern file, storing the bitstream file, and generating a final test configuration bitstream file comprising the test pattern as the test signal source file.

Further, step 3) may further comprise: if the configuration is unsuccessful, reading another configuration code stream by the master FPGA from the mass memories without needing to power-off, configuring the FPGA chip under test via the external test interface, and determining again whether the configuration is successful.

Further, the FPGA chip under test may be an FPGA chip using a bumping process.

In order to achieve the above goal, the present invention also provides an FPGA chip configuration and test system, comprising:

an automatic test equipment (ATE) test module, which provides a signal indicative of a request for configuration of an FPGA chip under test, generates a test signal, applies a test signal source file onto the FPGA chip under test and determines and analyzes the test results output therefrom, thereby accomplishing the testing of the FPGA chip under test;

a test and configuration board controlled by the ATE test module, the test and configuration board comprising a master FPGA and mass memories; and a computer (i.e., a PC terminal), adapted to configure the master FPGA of the test and configuration board, create configuration files and download configuration data for the FPGA chip under test;

wherein the mass memories are adapted to store the created configuration files, wherein with a control test algorithm configured on the ATE, the master FPGA reads a configuration code stream from the mass memories, configures the FPGA chip under test via an external interface, determines whether the configuration is successful, wherein in the event of the configuration being successful, the successfully configured configuration code stream is converted by the control test algorithm and a conversion tool into a test signal source file recognizable and executable by the ATE, and wherein the test signal source file comprises test signal source codes reusable by multiple pieces of test equipment.

Further, the configuration files may be created by providing by the ATE test module the signal indicative of the request for configuration of the FPGA chip under test and configuring by the computer an initiation signal for the test and configuration board and then stored in the mass memories.

Further, the mass memories may be flash memories.

Further, the master FPGA may read in real time configuration codes in different address ranges in the flash memories, wherein the ATE automatically loads a configuration file onto the FPGA chip under test via the external test interface in real time.

Further, a process of the configuration by the master FPGA comprises parsing a bitstream file, designing a test model, retrieving the model, designing a test pattern, modifying and filling the configuration bitstream file with the pattern file, storing the bitstream file, and generating a final test configuration bitstream file comprising the test pattern as the test signal source file.

Compared with the prior art, in the configuration and test method and system for an FPGA chip using a bumping process according to the present invention, configuration code streams are stored on the mass memories, configuration codes in different address ranges in the memories are read by the master FPGA in real time, and configuration files are automatically loaded by the advanced test equipment onto the FPGA chip under test in real time via the external test interface, thereby enabling fast configuration of the FPGA chip for testing of its functional and performance parameters without needing to power-off. This entails a solution capable of real-time, fast, repeatable configuration and functional and performance testing. It allows not only rapid download of multiple configuration code streams but also a higher configuration speed and lower implementation costs.

BRIEF DESCRIPTION OF THE DRAWINGS

FIG. 2 shows an exemplary configuration description according to a specific embodiment of the present invention.

FIG. 3 shows an exemplary FPGA configuration bitstream file according to a specific embodiment of the present invention.

FIG. 4 shows an exemplary test pattern according to a specific embodiment of the present invention.

DETAILED DESCRIPTION

Embodiments of the present invention will be described below by means of particular specific examples in conjunction with the accompany drawings. Other advantages and benefits of the invention will be readily understood by those skilled in the art from the disclosure herein. The present invention may also be implemented or utilized in other specific implementations, and various modifications or changes may be made to the details disclosed herein from different views and for different applications without departing from the spirit of the invention.

In view of the drawbacks of the prior art, the present invention proposes a method for FPGA chip configuration and testing based on real-time code stream download, which is suitable for use in testing FPGA chips, in particular, those using a bumping process.

As discussed in the background section, an FPGA chip using a bumping process has a large number of pins that is more than one thousand, imposing stricter requirements on automatic test equipment (ATE). In the testing of such an FPGA chip, configuration code streams and test vector files for testing of distinct functions vary from one another, and the sizes or lengths of these configuration code streams and test vector files are determined by complexity levels of the functions as well as by the test coverage, thus placing requirements on the ATE's test vector depth and configuration repeatability.

The core idea of the present invention is to download FPGA chip configuration files in real time, convert them into test vector files (test patterns) recognizable and executable by ATE and efficiently accomplish testing of the FPGA's functional and performance parameters without needing to power-off.

Figure 1:
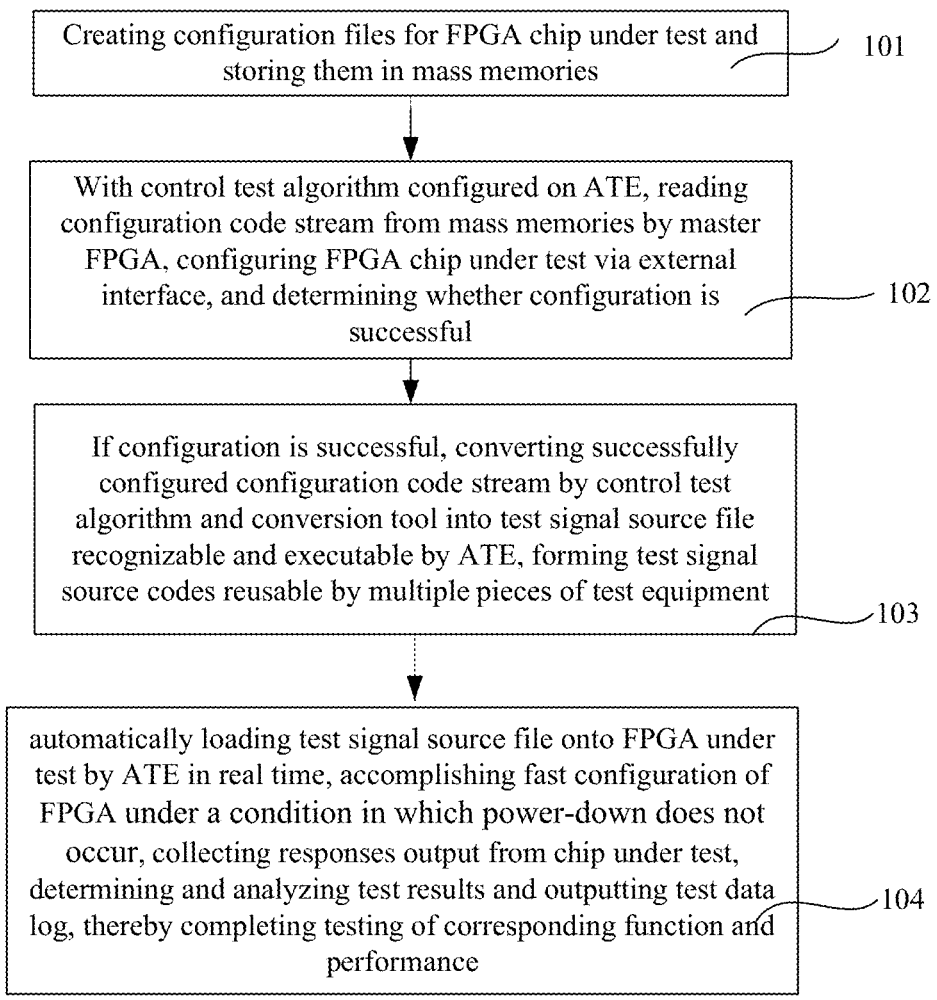
FIG. 1 is a flowchart showing the steps of an FPGA chip configuration and test method according to the present invention.

FIG. 1 is a flowchart showing the steps of an FPGA chip configuration and test method according to the present invention. As shown in FIG. 1, the FPGA chip configuration and test method according to the present invention includes the steps as detailed below.

In step 101, configuration files for a chip under test are created and stored on mass memories. Specifically, the configuration files may be created by providing by ATE a signal for requesting the configuration of a chip under test and configuring by a PC an initiation signal for a configuration system board and then stored on mass flash memories.

The configuration files allow loading of necessary data files during use of the FPGA. The data files impart specific functions to the FPGA and provide configuration data required by the FPGA's applications. The data files include information about resources for enabling the FPGA's functions, and each bit test code in the data files corresponds, i.e. being mapped, to a configuration resource. Such mappings serve as the basis of test algorithms.

Figures 2, 3:
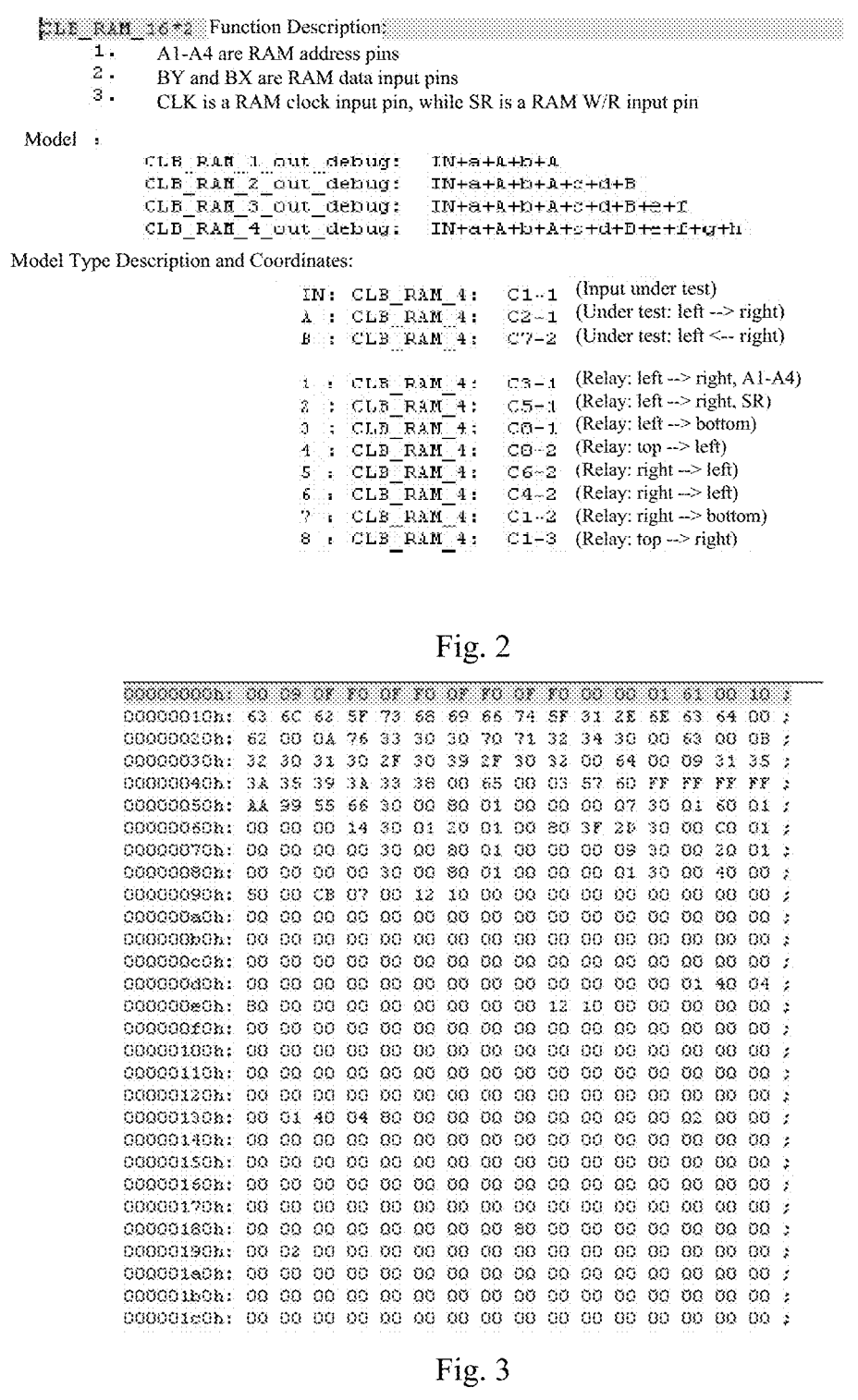

The present invention realizes multiple test algorithms through establishment of test models (here, the test models, i.e., the configuration files mentioned herein above, refer to functional tests for the FPGA's logic resources, while FPGA stands for Field Programmable Gate Array, and the FPGA have a large number of distinct logic resources), including: bus test algorithms, strong drive output test algorithms, PIP test algorithms, matrix test algorithms, distributed RAM test algorithms and CLB logic test algorithms. These algorithms are expandable, scalable and suitable to be used in the testing and development of FPGAs of various sizes and series, and their quality is related to the magnitude of test coverage and the length of test time. That is, the present invention allows real-time download and automatic conversion of configuration code streams realized by the multiple test algorithms into test signal source files recognizable and executable by the ATE. After all the configuration test models have been designed, it is needed to number the designed configuration modules in order to facilitate their future retrieval by retrieval software. Generally, each test pattern design should have a corresponding configuration description. FIG. 2 shows an exemplary configuration description according to a specific embodiment of the present invention, while FIG. 3 shows an exemplary FPGA configuration bitstream file according to a specific embodiment of the present invention.

In step 102, a master FPGA reads a configuration code stream from the mass memories (implemented as mass flash memories in specific embodiments of the invention) using a control test algorithm configured on the ATE, configures the FPGA under test via an external interface, and determines whether the configuration has succeeded. Specifically, the master FPGA may read in real time configuration codes in different address ranges within the flash memories, with the ATE automatically loading the configuration file onto the FPGA under test in real time via the external test interface, thereby allowing fast configuration of the FPGA for testing of its functional and performance parameters without needing to power-off. Here, it is noted that a basic concept for the configuration is as follows: parsing a bitstream file→designing a test model→retrieving the model→designing a test pattern→modifying and filling the configuration bitstream file with the pattern file→storing the bitstream file→generating a final test configuration bitstream file containing the test pattern, wherein erasure, recording, reading, verification and like processes are involved, and the verification process is the determination of whether the configuration has succeeded.

Figure 4:
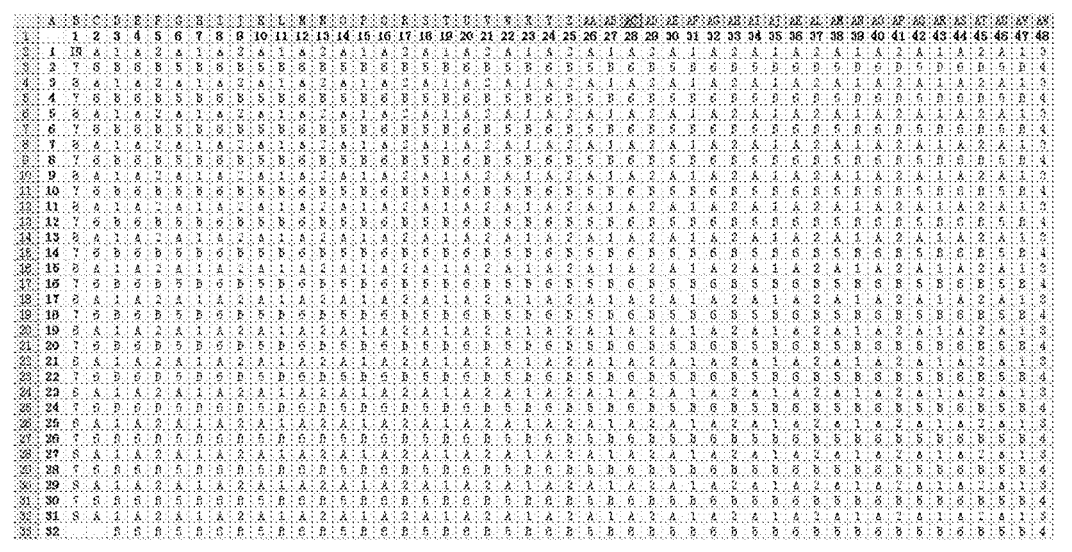

The master FPGA is a core control component in the configuration system board responsible for receiving configuration data and configuration mappings from the PC during the download of a configuration file and writing them into a corresponding memory. During the testing, it is responsible for responding to test request signals and signals for configuration of the FPGA under test generated by the ATE, reading a corresponding configuration code stream file from the corresponding memory, configuring the chip under test and forming a test pattern. FIG. 4 shows an exemplary test pattern according to a specific embodiment of the present invention.

In step 103, if the configuration is successful, the successfully configured configuration code stream is converted by the control test algorithm and by a conversion tool into a test signal source file recognizable and executable by the ATE, generating test signal source codes reusable by multiple pieces of equipment.

In step 104, the test signal source file is automatically loaded by the ATE onto the FPGA under test in real time, accomplishing fast FPGA configuration without needing to power-off . In addition, responses from the chip under test are collected, the test results are determined and analyzed and a test data log is output, accomplishing the testing of a corresponding function and performance.

Figure 5:
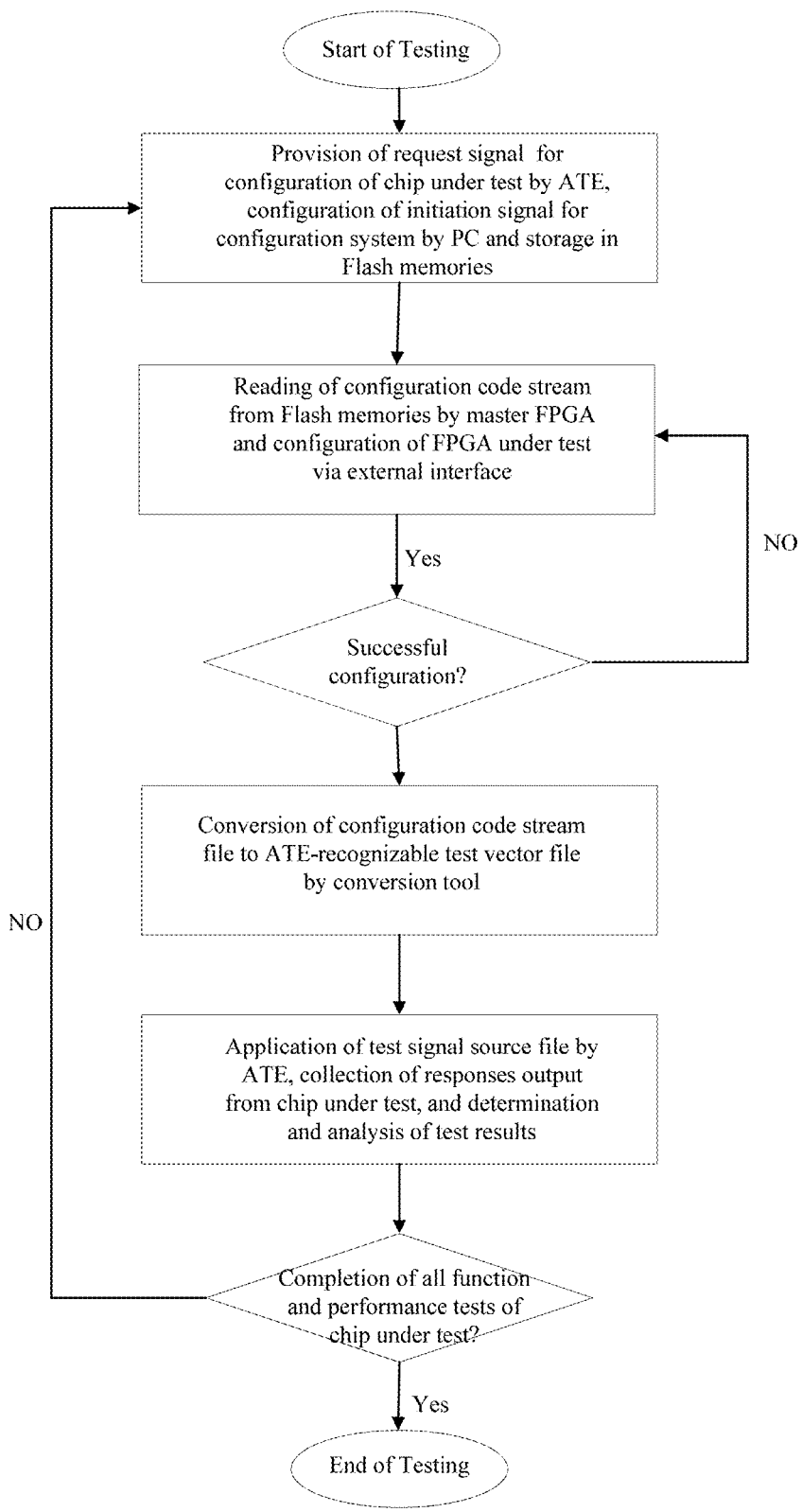
FIG. 5 is a flowchart illustrating steps according to a preferred embodiment of the present invention.

FIG. 5 is a flowchart illustrating steps according to a preferred embodiment of the present invention. In this preferred embodiment of the present invention, first of all, the ATE provides a signal indicative of a request for configuring a chip under test, and the PC then configures an initiation signal for the configuration system which subsequently forms configuration files and stores them on the flash memories. After that, the master FPGA reads a configuration code stream from the flash memories and configures the FPGA under test via the external interface. That is, the master FPGA reads configuration codes in different address ranges within the flash memories in real time and the ATE automatically loads the configuration file onto the FPGA under test in real time via the external test interface. It is then determined whether the configuration has succeeded. If the configuration is successful, the configuration code stream file is converted by the conversion tool into an ATE-recognizable test signal source file. Otherwise, reconfiguration is performed, i.e., the master FPGA reading another configuration code stream from the mass memories without needing to power-off, configuring the FPGA chip under test via the external test interface, and determining again whether the configuration is successful. Upon success of the configuration, the ATE applies a test signal source file and the chip under test outputs responses, based on which the test results are determined. It is then determined whether all the functions and performance of the chip under test have been tested. Upon completion, the testing is ended. Otherwise, configuration files are reestablished for testing.

Figure 6:
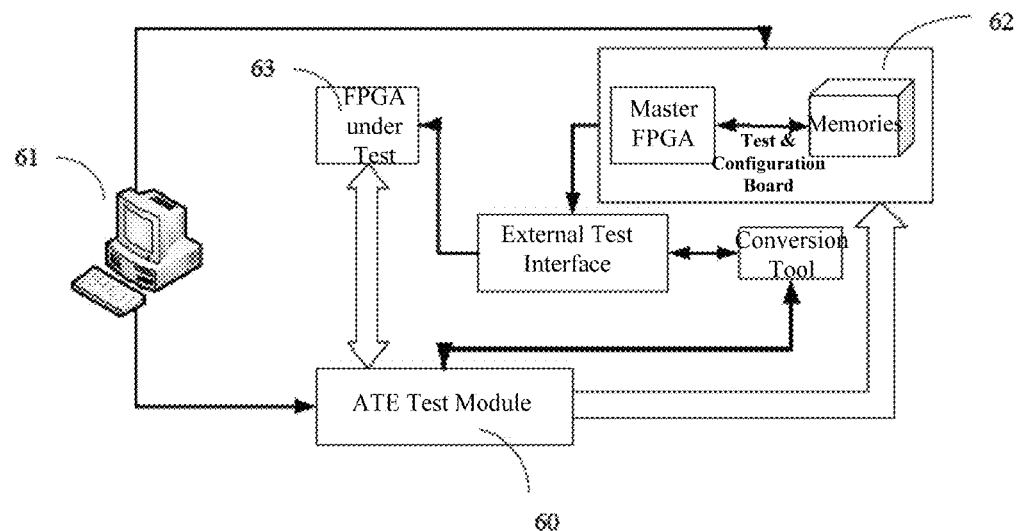
FIG. 6 is a diagram showing the architecture of an FPGA chip configuration and test system according to the present invention.

FIG. 6 is a diagram showing the architecture of an FPGA chip configuration and test system according to the present invention. As shown in FIG. 6, the FPGA chip configuration and test system according to the present invention comprises: an ATE test module 60; a PC terminal 61; a test and configuration board 62; and an FPGA under test 63.

The ATE test module 60 is adapted to provide a signal indicative of a request for configuring the chip under test and control the test and configuration board to generate a test signal. In addition, the ATE test module 60 applies a test signal source file to the FPGA under test 63 and determines and analyzes the test results output therefrom, allowing testing of the FPGA under test 63. The PC terminal 61 is adapted to configure a master FPGA in the test and configuration board 62, create configuration files, and download configuration data for the FPGA chip under test 63. The test and configuration board 62 includes the master FPGA and memories which may be, for example, NOR mass flash memories, for storing the created configuration files. With a control test algorithm configured on an ATE, the master FPGA reads a configuration code stream from the memories, configures the FPGA under test 63 via an external test interface and determines whether the configuration is successful. Upon success of the configuration, the control test algorithm together with a conversion tool converts the successfully configured configuration code stream into a test signal source file recognizable and executable by the ATE, generating test signal source codes reusable by multiple pieces of equipment.

Figure 7:
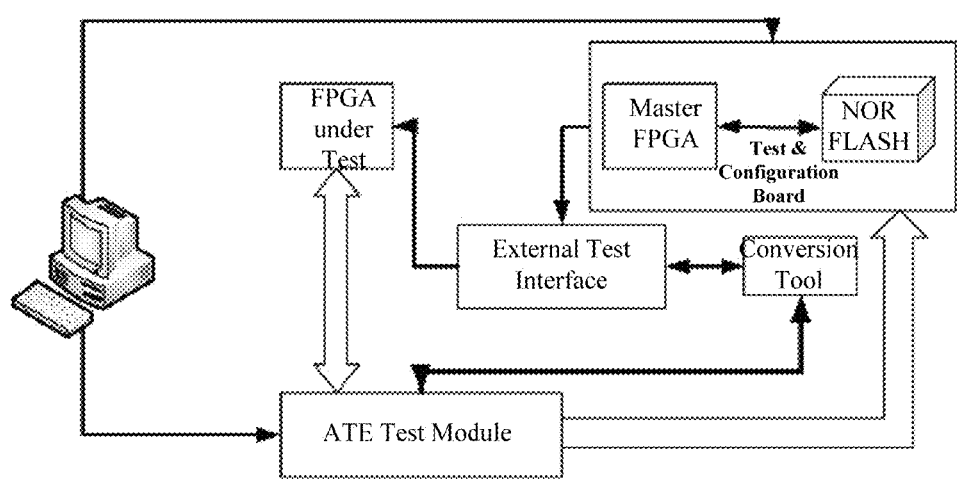
FIG. 7 shows an architecture according to a specific embodiment of the present invention.

FIG. 7 shows an architecture according to a specific embodiment of the present invention. In the specific embodiment of the present invention, the PC terminal is essentially adapted to configure the master FPGA and download configuration data for the FPGA chip under test. During testing of functional parameters of the FPGA by the ATE, the PC terminal commissions the control test and configuration board for configuration of the test code stream, resulting in time savings and increased efficiency. The flash memories are adapted to store repeatedly reconfigured configuration code streams needed for testing of the FPGA chip. High-coverage FPGA testing requires a large number of configuration code streams for testing various FPGA functions. These configuration code streams are stored in different areas in the flash memories. The flash memories are advantageous in that they can be combined into an array for storing a plurality of configuration code streams. The ATE test module 60 is responsible for providing power supply, controlling the configuration and test board and generating a test signal for dictating the control test and configuration board to start downloading a desired configuration code stream, and meanwhile, the ATE applies test vector signals to the FPGA under test and determines and analyzes the test results output therefrom, thereby accomplishing the testing of the FPGA 63. Upon the master FPGA receiving a test request from the ATE, it feeds the request to the PC terminal. The PC terminal then transmits corresponding configuration files, and the files are written in the flash memories. This can be conducted in parallel to the testing of other functional parameters. During testing, the master FPGA reads a configuration file from the flash memories for configuration of the FPGA under test, thereby completing the test. The present invention is advantageous in multiple, parallel, independent processing routes which allow time savings and increased test efficiency.

Further, the present invention also addresses the inflexible configuration problem in the existing FPGA test solutions in which a reconfiguration process can only be initiated and ended by power-off followed by power-on. Such repeated power-off and power-on not only increases test complexity and test time but is also prone to cause chip damages and test discontinuations. In addition, power-off may lessen the test coverage of the FPGA chip under test.

As apparent from the above description, the configuration and test method and system for an FPGA chip using a bumping process according to the present invention can obviously improve FPGA test efficiency and coverage and increase configuration generality, timeliness and continuity. According to the present invention, configuration code streams are stored on mass flash memories, and configuration codes are read in real time by the master FPGA from different address ranges within the flash memories and are used to configure the chip under test via the external test interface. If the configuration is successful, then the configuration file is converted by the conversion tool into a test signal source file recognizable and executable by the ATE. The ATE then automatically loads it in real time onto the FPGA under test, enabling fast configuration of the FPGA for testing of its functional and performance parameters without needing to power-off. This entails a solution capable of real-time, fast, repeatable configuration and functional and performance testing.

The above embodiments are presented merely to illustrate the principles and benefits of the present invention by means of examples and are not intended to limit the invention. Any person skilled in the art may make modifications or changes to the embodiments disclosed above without departing from the spirit and scope of the invention. Accordingly, the scope of the present invention is as defined in the appended claims.

What is claimed is:

1. A method of configuration and test of an FPGA chip, comprising the steps of:
   1) creating configuration files for an FPGA chip under test and storing the configuration files in a mass memory, the configuration files comprising information about a plurality of configuration resources required for function test of the FPGA chip under test, wherein each of a plurality of configuration codes comprised in the configuration files is mapped to a corresponding one of the plurality of configuration resources;
   2) reading, by a master FPGA, a configuration code stream comprising corresponding configuration codes from the mass memory according to a control test algorithm developed based on an automatic test equipment (ATE), configuring the FPGA chip under test via an external test interface, and determining whether the configuration is successful;
   3) if the configuration is successful, converting the successfully configured configuration code stream into a test signal source file recognizable and executable by the ATE by using the control test algorithm and a conversion tool, the test signal source file comprising test signal source codes reusable by multiple test equipment; reading another configuration code stream by the master FPGA from the mass memory without power-off if the configuration is unsuccessful and, configuring the FPGA chip under test via the external test interface, and determining again whether the configuration is successful; and
   4) automatically loading the test signal source file onto the FPGA chip under test by the ATE in real time, collecting responses output from the FPGA chip under test, determining and analyzing test results and outputting a test data log, thereby completing the function test and corresponding performance test.

2. The method of configuration and test of an FPGA chip according to claim 1, wherein in step 1), the configuration files are created by providing, by the ATE, a request signal for configuration of the FPGA chip under test; and configuring, by a computer, an initiation signal for a test and configuration board, and wherein the configuration files are then stored in the mass memory.

3. The method of configuration and test of an FPGA chip according to claim 2, wherein the mass memory is a flash memory.

4. The method of configuration and test of an FPGA chip according to claim 3, wherein in step 2), the master FPGA reads in real time the configuration codes stored at different addresses in the flash memory, and the ATE automatically loads the configuration file onto the FPGA chip under test via the external test interface in real time.

5. The method of configuration and test of an FPGA chip according to claim 2, wherein in step 2), the configuration comprises parsing a bitstream file, designing a test model, retrieving the model, designing test patterns, modifying and filling the configuration bitstream file with pattern files, storing the bitstream file, and generating a final test configuration bitstream file comprising the test patterns as the test signal source file.

6. The method of configuration and test of an FPGA chip according to claim 1, wherein the FPGA chip under test is an FPGA chip using a bumping process.

7. A configuration and test system for an FPGA chip, comprising:
 an automatic test equipment (ATE) test module, which provides a request signal for configuration of an FPGA chip under test, generates a test signal, applies a test signal source file onto the FPGA chip under test and determines and analyzes test results output therefrom, thereby accomplishing test of the FPGA chip under test;
 a test and configuration board controlled by the ATE test module, the test and configuration board comprising a master FPGA and a mass memory; and
 a computer, adapted to configure the master FPGA of the test and configuration board, create configuration files and download configuration data for the FPGA chip under test;
 wherein the mass memory is adapted to store the created configuration files, wherein with a control test algorithm configured on the ATE, the master FPGA reads a configuration code stream from the mass memory, configures the FPGA chip under test via an external interface, determines whether the configuration is successful, wherein if the configuration is successful, the successfully configured configuration code stream is converted into a test signal source file recognizable and executable by the ATE by using the control test algorithm and a conversion tool, and wherein the test signal source file comprises test signal source codes reusable by multiple test equipment; if the configuration is unsuccessful, the master FPGA reads another configuration code stream from the mass memory without power off, configures the FPGA chip under test via the external test interface, and determines again whether the configuration is successful.

8. The configuration and test system for an FPGA chip according to claim 7, wherein the configuration files are created by providing, by the ATE test module, the request signal for configuration of the FPGA chip under test; and configuring, by the computer, an initiation signal for the test and configuration board, and wherein the configuration files are then stored on the mass memory.

9. The configuration and test system for an FPGA chip according to claim 7, wherein the mass memory is flash memory.

10. The configuration and test system for an FPGA chip according to claim 9, wherein the master FPGA reads in real time configuration codes stored at different addresses in the flash memory, and wherein the ATE automatically loads the configuration file onto the FPGA chip under test via the external test interface in real time.

11. The configuration and test system for an FPGA chip according to claim 7, the configuration by the master FPGA comprises parsing a bitstream file, designing a test model, retrieving the model, designing test patterns, modifying and filling the configuration bitstream file with pattern files, storing the bitstream file, and generating a final test configuration bitstream file comprising the test patterns as the test signal source file.

12. The configuration and test system for an FPGA chip according to claim 7, wherein the FPGA chip under test is an FPGA chip using a bumping process.

* * * * *